(12) United States Patent
Ali et al.

(10) Patent No.: US 11,984,362 B1
(45) Date of Patent: May 14, 2024

(54) CONTROL OF LOCOS STRUCTURE THICKNESS WITHOUT A MASK

(71) Applicant: Texas Instruments Incorporated, Dallas, TX (US)

(72) Inventors: Abbas Ali, Plano, TX (US); Christopher Scott Whitesell, Garland, TX (US); John Christopher Shriner, Lucas, TX (US); Henry Litzmann Edwards, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/411,761

(22) Filed: Aug. 25, 2021

(51) Int. Cl.
*H01L 21/8234* (2006.01)
*H01L 27/088* (2006.01)

(52) U.S. Cl.
CPC .... *H01L 21/823462* (2013.01); *H01L 27/088* (2013.01)

(58) Field of Classification Search
CPC ......... H01L 21/76202; H01L 21/76221; H01L 27/088; H01L 29/42368
See application file for complete search history.

(56) References Cited

U.S. PATENT DOCUMENTS

| | | | | |
|---|---|---|---|---|
| 5,472,904 A | * | 12/1995 | Figura | H01L 21/76205 257/E21.547 |
| 2004/0259323 A1 | * | 12/2004 | King | H01L 21/76202 257/E21.552 |
| 2006/0138584 A1 | * | 6/2006 | Ko | H01L 29/0653 257/E21.546 |
| 2021/0233924 A1 | * | 7/2021 | Xiang | H01L 21/28167 |

* cited by examiner

*Primary Examiner* — John A Bodnar
(74) *Attorney, Agent, or Firm* — Andrew R. Ralston; Frank D. Cimino (57) ABSTRACT

A method of fabricating an integrated circuit includes forming a first opening having a first width and a second opening having a second width in a first dielectric layer over a silicon substrate. The openings expose the silicon substrate and the exposed silicon substrate is oxidized to form first and second LOCOS structures having a first thickness. A polysilicon layer is formed over the silicon substrate, so that the polysilicon layer fills the first and second openings. A blanket etch of the polysilicon layer is performed to remove at least a portion of the polysilicon layer over the second LOCOS structure while leaving the first LOCOS structure protected by the polysilicon layer. The silicon substrate under the second LOCOS structure is further oxidized such that the second LOCOS structure has a second thickness greater than the first thickness.

20 Claims, 11 Drawing Sheets

CONTROL OF LOCOS STRUCTURE THICKNESS WITHOUT A MASK

FIELD OF THE DISCLOSURE

Disclosed implementations relate generally to the field of semiconductor fabrication, and more particularly, but not exclusively, to forming local oxidation of silicon (LOCOS) structures with different thicknesses on a same semiconductor substrate.

BACKGROUND

LOCOS structures having different thickness are sometimes formed over a same semiconductor substrate, e.g. to form metal oxide semiconductor (MOS) transistors having different operating voltages.

SUMMARY

The present application improves upon known methods of forming first and second LOCOS structures having different thickness on a same substrate by eliminating a mask level. Methods of the disclosure use a blanket etch of a sacrificial layer, rather than a patterned etch, to leave a first LOCOS structure protected while providing an opening over a second LOCOS structure. In order to use the blanket etch effectively, the first LOCOS structure can be covered by an oxygen diffusion barrier (ODB) layer, while a portion of the second LOCOS structure can be exposed. A wafer on which the LOCOS structures are formed is then subjected to an oxidation process, allowing the second LOCOS structure to grow to a greater thickness while maintaining the first LOCOS structure at an original thickness.

In order to facilitate the use of this process, a test database is created by subjecting test wafers, which contain openings formed through an ODB layer, the openings having multiple different widths and multiple different silicon recess depths. Test wafers are characterized using different thicknesses of a sacrificial layer formed over the ODB layer followed by etching of the sacrificial layer to stop on the ODB layer. Test data is collected, using physical characterization of the openings, and correlated to form the test database; the test data includes the width of openings that remain covered at the end of etching, as well as information on the depth and angle of any portions of the sacrificial layer that remain in the openings. For a new chip having a previously unused combination of LOCOS thicknesses, once a width of a first opening for the first LOCOS structure is determined, the test database can be used to select a depth of the sacrificial layer and then a width of a second opening for the second LOCOS structure, cutting the time for providing modifications to the process. While such embodiments may be expected to improve the manufacturability of such integrated circuits employing the dual thicknesses of LOCOS structure, no particular result is a requirement of the described invention(s) unless explicitly recited in a particular claim.

In one aspect, an implementation is disclosed of a method of fabricating an integrated circuit. The method includes forming a first opening having a first width and a second opening having a second width in a first dielectric layer over a silicon substrate, the openings exposing the silicon substrate; oxidizing the exposed silicon substrate to form first and second LOCOS structures having a first thickness; forming a polysilicon layer over the silicon substrate, the polysilicon layer filling the first and second openings; performing a blanket etch of the polysilicon layer, thereby removing at least a portion of the polysilicon layer over the second LOCOS structure while leaving the first LOCOS structure protected by the polysilicon layer; further oxidizing the silicon substrate under the second LOCOS structure such that the second LOCOS structure has a second thickness greater than the first thickness.

In another aspect, an implementation of a method of fabricating an integrated circuit (IC) is disclosed. The method includes determining a deposition thickness of a sacrificial layer to be formed over a semiconductor substrate having an ODB layer located thereover, the ODB layer having first and second openings respectively having a first width and a greater second width that expose the semiconductor substrate, the determining being based on one or both of the first width and the second width; forming a first LOCOS structure under the first opening and a second LOCOS structure under the second opening; forming the sacrificial layer having the deposition thickness over the semiconductor substrate, the ODB layer and the first and second openings; and blanket etching the sacrificial layer, the deposition thickness being such that the first LOCOS structure is completely covered by a first remaining portion of the sacrificial layer after the blanket etching, and the second LOCOS structure is exposed between sidewall spacers located over the second LOCOS structure.

In yet another aspect, an implementation of a method of fabricating an integrated circuit is disclosed. The method includes selecting a polysilicon thickness of a polysilicon layer predetermined to result in a continuous first remaining portion of the polysilicon layer remaining in a first opening having a first width in an ODB layer over a silicon substrate after removing the polysilicon layer over the ODB layer; selecting a second width based on the polysilicon thickness, the second width predetermined to result in a space between second remaining portions of the polysilicon layer in a second opening having the second width in the ODB layer after removing the polysilicon layer over the ODB layer; forming the ODB layer over the silicon substrate; forming in the ODB layer the first opening having the first width and the second opening having the second width; forming a first LOCOS structure in the first opening and a second LOCOS structure in the second opening; and forming the polysilicon layer over the silicon substrate, filling the first and second openings.

BRIEF DESCRIPTION OF THE DRAWINGS

Implementations of the present disclosure are illustrated by way of example, and not by way of limitation, in the figures of the accompanying drawings in which like references indicate similar elements. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described.

The accompanying drawings are incorporated into and form a part of the specification to illustrate one or more exemplary implementations of the present disclosure. Various advantages and features of the disclosure will be understood from the following Detailed Description taken in connection with the appended claims and with reference to the attached drawing figures in which:

DETAILED DESCRIPTION

Specific implementations of the invention will now be described in detail with reference to the accompanying figures. In the following detailed description of implementations of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

U.S. Pat. No. 10,529,812 ("the '812 patent"), incorporated herein by reference in its entirety, describes a method of forming LOCOS structures having different thicknesses on a same substrate. In brief summary, such method first forms first and second LOCOS structures having a same thickness. An ODB layer is formed over both LOCOS structures, and then patterned using a masked photolithography step to form an opening over the second LOCOS structure while leaving the first LOCOS structure covered. An oxidation process is performed that causes the thickness of the second LOCOS structure to increase while the thickness of the first LOCOS structure remains essentially unchanged. The photolithography step is eliminated in methods of the disclosure described below, reducing product cost and cycle time.

Figure 1A:
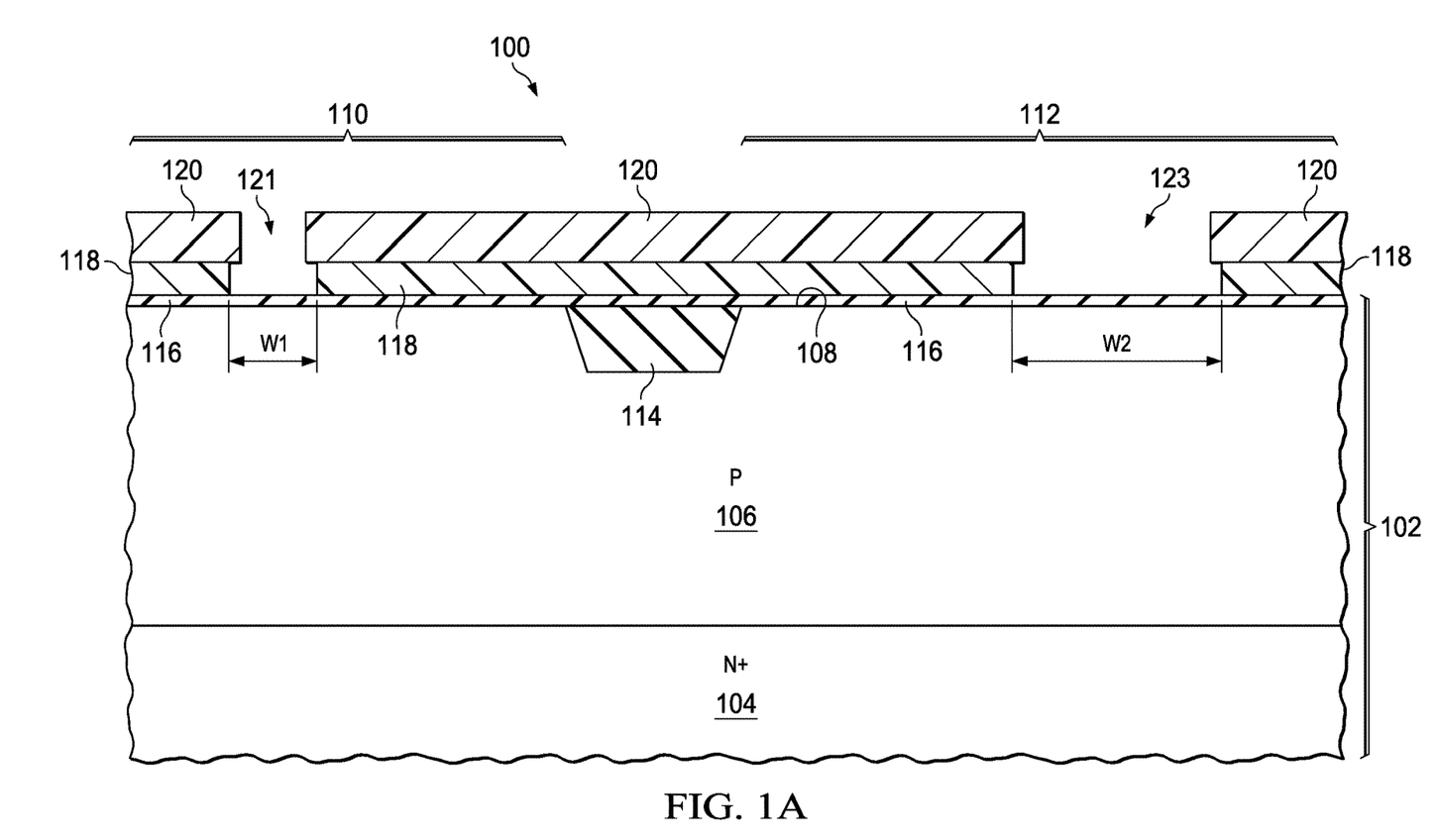
FIGS. 1A-1H depicts successive cross-sections of a substrate as portions of an integrated circuit are fabricated according to an implementation of the disclosure.

In a method of the disclosure, FIG. 1A through FIG. 1H depict successive cross sections during the fabrication of a first MOS transistor 110 and a second MOS transistor 112 contained in an IC 100. In the implementations shown in these figures, the first MOS transistor 110 and the second MOS transistor 112 are LDMOS transistors, although other types of MOS transistors may also be formed. Referring to FIG. 1A, a substrate 102 may be formed by starting with a P-type silicon wafer, which may have at least one epitaxial layer thereon, and forming an N-type buried layer 104 by ion implanting N-type dopants such as antimony or arsenic. A thermal drive process heats the substrate to activate and diffuse the implanted N-type dopants. A P-type layer 106 may be formed over the substrate by an epitaxial process with in-situ P-type doping. The epitaxially formed material may have a thickness in the range, for example of about 4 microns to 6 microns. The N-type dopants diffuse partway into the epitaxially grown material, so that the N-type buried layer 104 overlaps a boundary between the original silicon substrate and the epitaxially grown material.

A field oxide 114 is formed at a top surface 108 of the substrate 102, for example by a shallow-trench isolation (STI) process or a LOCOS process to create isolation trenches between the devices being formed. A pad oxide layer 116 is formed at a top surface 108 of the substrate 102, e.g., by thermal oxidation or by any of several chemical vapor deposition (CVD) processes. A first ODB layer 118 is formed over the pad oxide layer 116. The first ODB layer 118 may include, for example, silicon nitride, formed by a low-pressure chemical vapor deposition (LPCVD) process using dichlorosilane and ammonia. Alternatively, silicon nitride for the first ODB layer 118 may be formed by decomposition of bis(tertiary-butyl-amino) silane (BTBAS). Other processes to form the first ODB layer 118 are possible.

An etch mask 120 is formed over the first ODB layer 118 in which the etch mask 120 contains a first opening 121 and a second opening 123. The etch mask 120 may include photoresist formed by a photolithography process, and may also include hard mask material such as amorphous carbon, and may include an anti-reflection layer such as an organic bottom anti-reflection coat (BARC).

The first ODB layer 118 is removed in the areas not covered by the etch mask 120, exposing the pad oxide layer 116. A portion of the pad oxide layer 116 may also be removed in the areas exposed by the etch mask 120. As the first opening 121 and the second opening 123 are extended through the first ODB layer 118, the areas of the substrate 102 that are exposed have different widths, e.g., the first opening 121 exposes a portion of the substrate 102 having a first width W1 and the second opening 123 exposes a portion of the substrate 102 having a second width W2 that is greater than the first width W1. The second width W2 is also sufficiently wide so that a central portion of the etched area can remain clear after formation of dielectric sidewalls, as will be demonstrated.

Exposed portions of the first ODB layer 118 may be removed by a wet etch, which may undercut the etch mask 120 as depicted in FIG. 1A. Alternatively, the exposed portions of the first ODB layer 118 may be removed by plasma etch, which may produce less undercut. The etch mask 120 may optionally be removed after etching the first ODB layer 118, or may be left in place to provide additional stopping material in a subsequent ion implant step. At this point there is an option for a silicon etch by etching the pad oxide layer 116 to expose the top surface 108 in the first opening 121 and the second opening 123 and performing a silicon etch before the first LOCOS process. Such a silicon etch may be used to enable deeper current flow for the first MOS transistor 110 and the second MOS transistor 112.

Figure 1B:
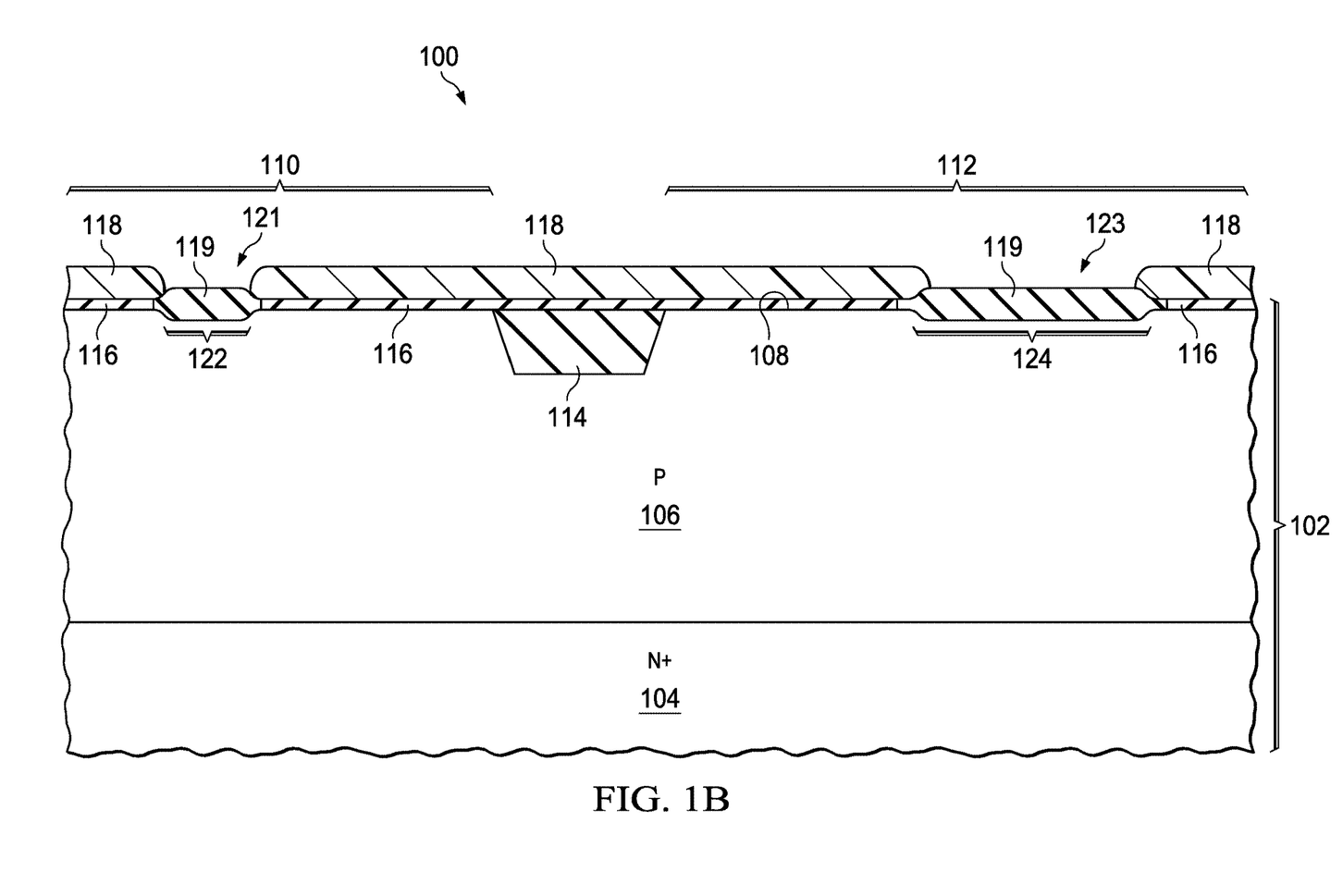

Turning to FIG. 1B, the IC 100 depicts the results after growing a first LOCOS layer 119 and forming a first LOCOS structure 122 in the first opening 121 and a second LOCOS structure 124 in the second opening 123. In one implementation, the first LOCOS layer 119 has a typical thickness in the range of about 200 Å to 1,000 Å, and may be formed by thermal oxidation, so that the first LOCOS structure 122 and the second LOCOS structure 124 have essentially the same thickness and both display the characteristic LOCOS oxidation bird's beaks shown.

An example furnace thermal oxidation process for growing a first LOCOS layer 119 may include ramping a temperature of the furnace to about 1000° C. in a time period of 45 minutes to 90 minutes with an ambient of 2 percent to 10 percent oxygen, maintaining the temperature of the furnace at about 1000° C. for a time period of about 10 minutes to 20 minutes while increasing the oxygen in the ambient to about 80 percent to 95 percent oxygen, maintaining the temperature of the furnace at about 1000° C. for a time period of about 60 minutes to 120 minutes while maintaining the oxygen in the ambient at about 80 percent to 95 percent oxygen and adding hydrogen chloride gas to the ambient, maintaining the temperature of the furnace at about 1000° C. for a time period of 30 minutes to 90 minutes while maintaining the oxygen in the ambient at 80 percent to 95 percent oxygen with no hydrogen chloride, and ramping the temperature of the furnace down in a nitrogen ambient. There can be an optional self-aligned (un-masked) ion implant before the depositions described below, to place boron below what will later be formed as a drift region.

Figure 1C:
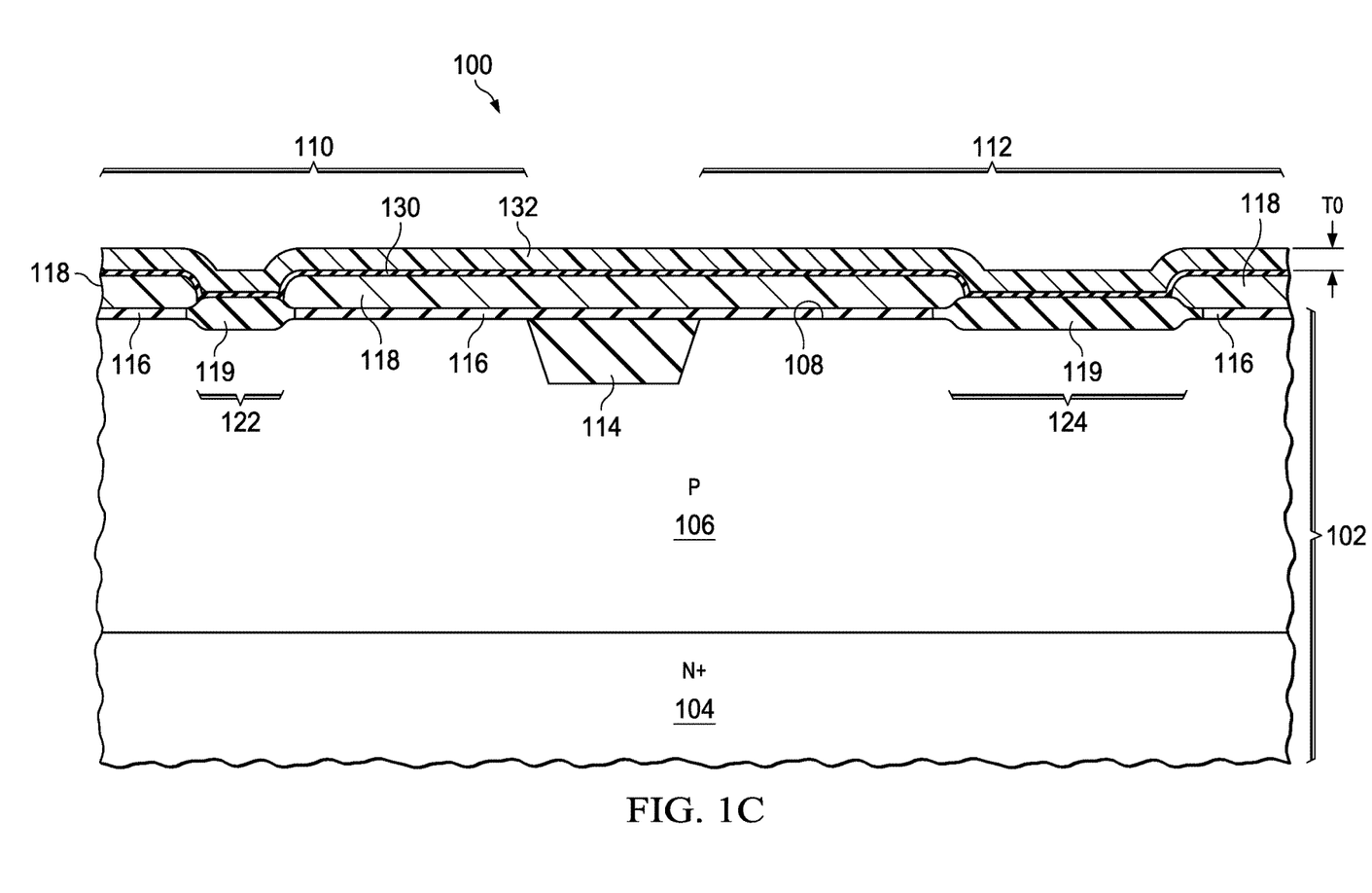

FIG. 1C depicts the IC 100 after deposition of a second ODB layer 130, followed by deposition of a sacrificial layer 132 thereon that functions to provide sacrificial sidewalls. Both the second ODB layer 130 and the sacrificial layer 132 are conformal and generally follow the level of the underlying surface. The sacrificial layer 132 has a thickness TO, the importance and selection of which will be further discussed below. In one implementation, the second ODB layer 130 can comprise silicon nitride (SiN) that can have a thickness in the range of about 100 Å to 500 Å and the sacrificial layer 132 can comprise polysilicon or a dielectric material that can have a thickness in the range of about 400 Å to 1,500 Å. In one implementation, a sacrificial layer of polysilicon may be formed in a traditional vertical furnace with a traditional CVD process using silane and $N_2$ gases. The sacrificial layer of polysilicon may be blanket etched using a reactive anisotropic plasma etch with a gas mixture of chloro/fluoro-carbons.

Figure 1D:
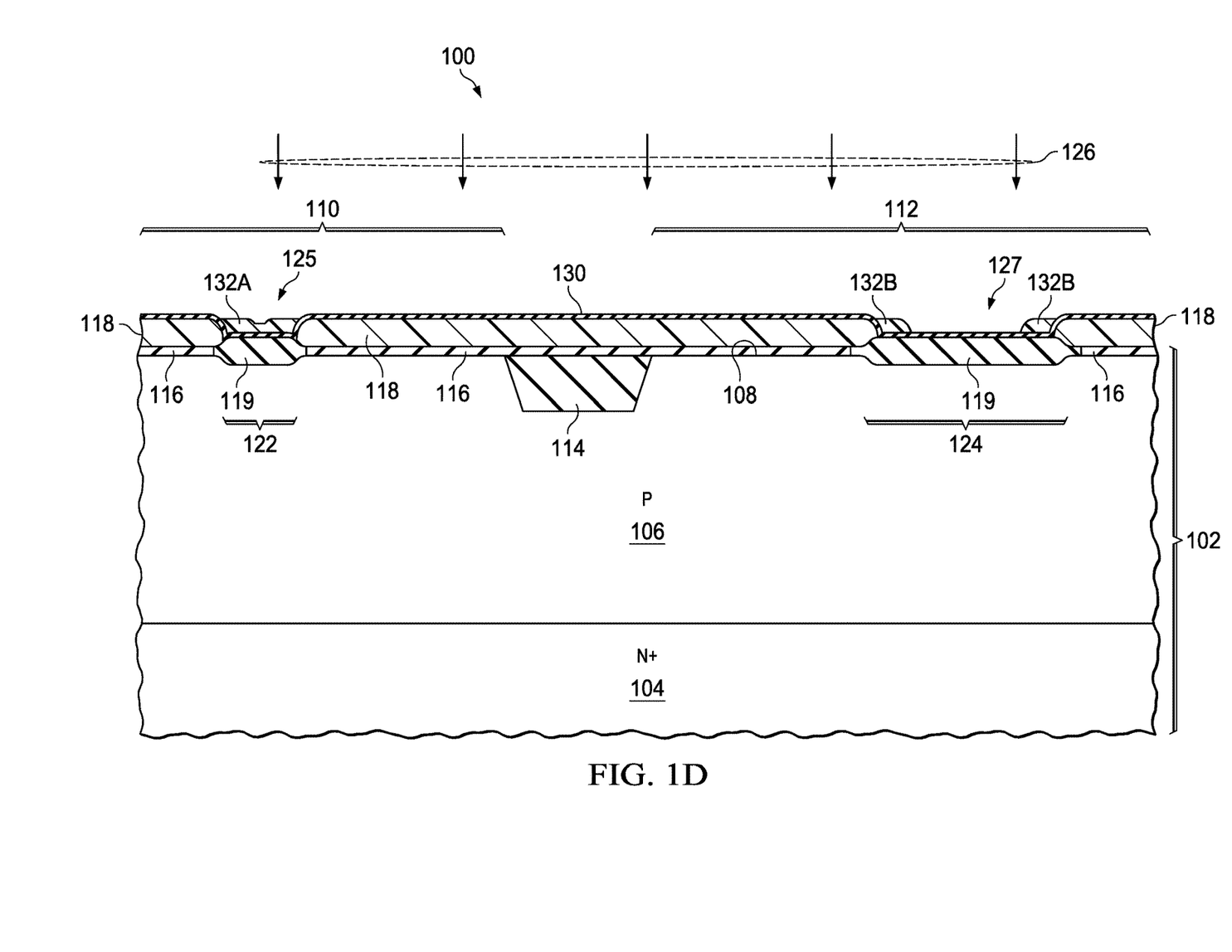

FIG. 1D depicts the IC 100 after the sacrificial layer 132 is etched using a blanket etch process 126 to stop on the second ODB layer 130, resulting in only remnants of the sacrificial layer 132 remaining. A first region 125 overlying the first LOCOS structure 122 remains filled with a sacrificial remnant 132A of the sacrificial layer 132, while the central portion of a second region 127 overlying the second LOCOS structure 124 has been largely cleared of the sacrificial layer 132 leaving sacrificial sidewall spacers 132B.

The formation of sacrificial sidewall spacers 132B differs from the formation of the sidewall spacers in known conventional methods, e.g. as described in the '812 patent, in which the sacrificial layer is patterned using a mask to form the desired sidewall spacers. Use of a blanket etch for the formation of the sidewall spacers saves the need for a mask for patterning the sacrificial layer and saves production costs. However, in order for etching of the sacrificial layer 132 to form the sacrificial sidewall spacers 132B in the second region 127, but leave the sacrificial remnant 132A in the first region 125, it can be advantageous to use care in setting the widths, e.g., the critical dimensions (CDs), of the openings for the first LOCOS structure 122 and the second LOCOS structure 124, as well as the thickness of the sacrificial layer 132. A two-part method can be used, with a first part of the method performed once to collect and chart test values, while a second part can be used repeatedly when new chips are designed using the same production methods but providing different thicknesses for the LOCOS structures and thus allowing different operating voltages for the associated MOS transistors. The method will be discussed with regard to FIGS. 2A and 2B.

Figure 1E:
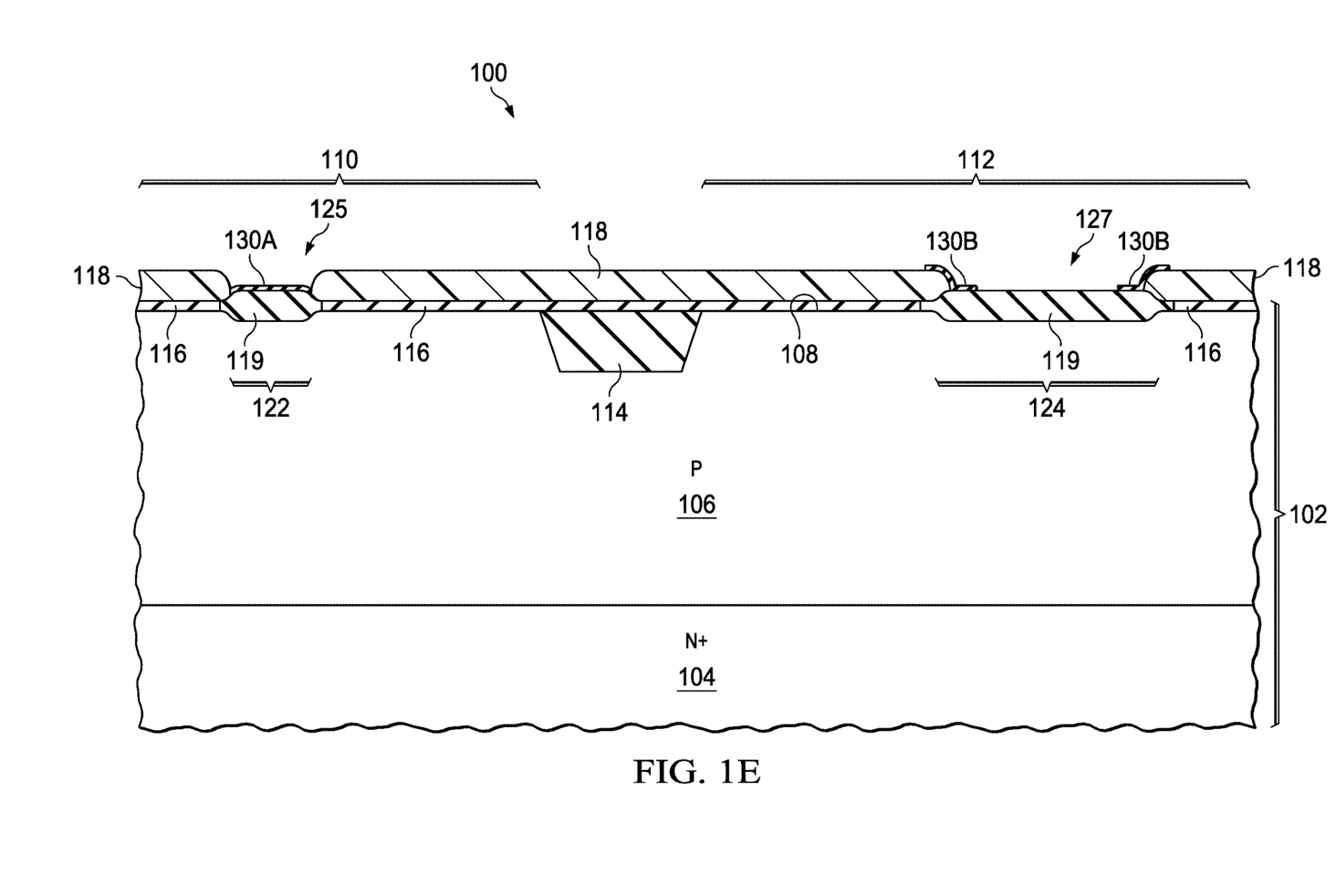

FIG. 1E depicts the IC 100 after stripping away the sacrificial sidewall spacers 132B and the sacrificial remnant 132A that are shown in FIG. 1D, as well as an unreferenced portion of the layer 130 over the LOCOS layer 119, leaving only an ODB remnant 130A in the first region 125 and ODB spacers 130B in the second region 127 providing a barrier to further oxidation of the covered portions of the LOCOS areas.

Figure 1F:
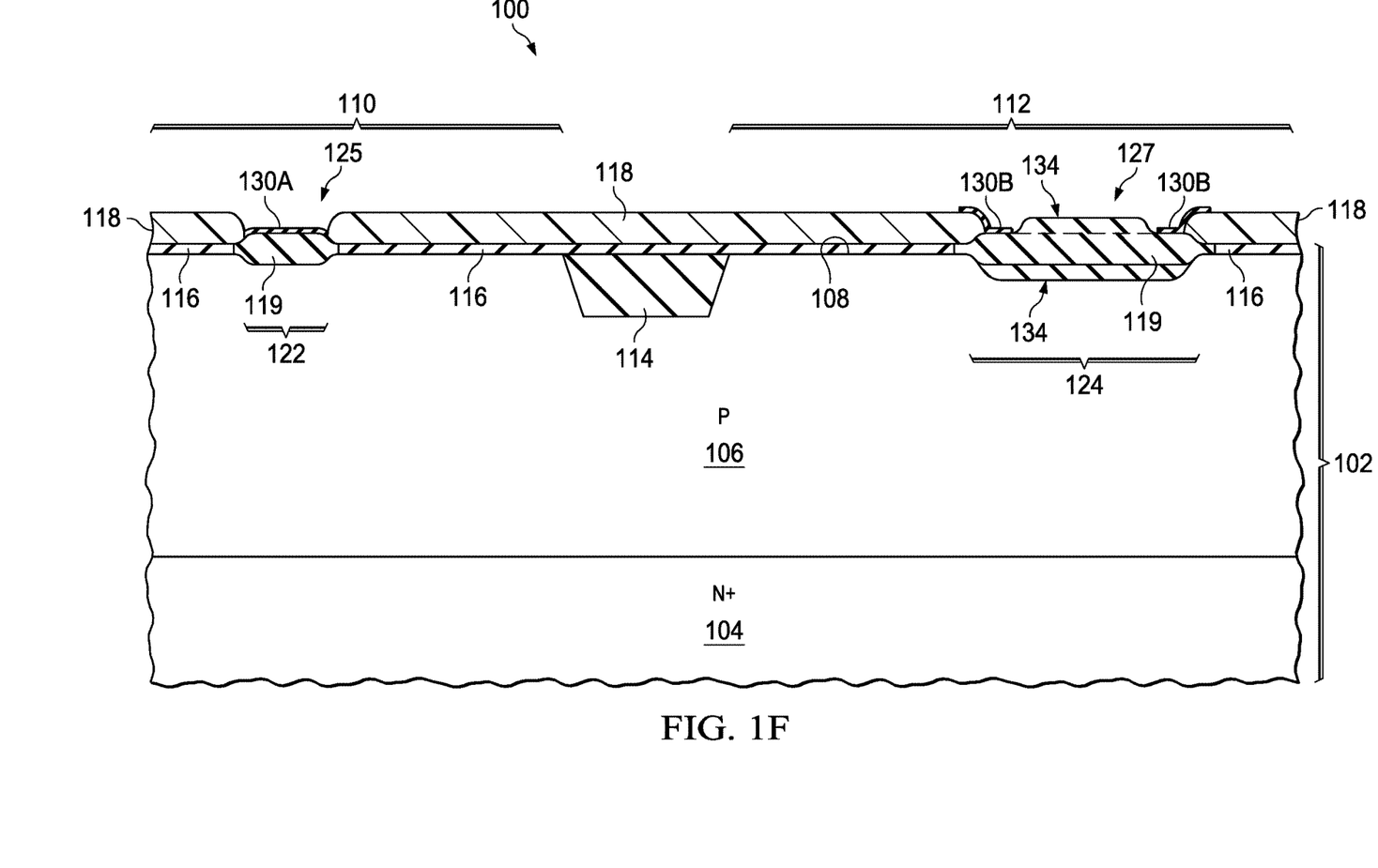

FIG. 1F depicts the IC 100 after a second LOCOS layer 134 is grown over the second LOCOS structure 124, with the additional growth shown both above and below the first LOCOS layer 119. The furnace thermal oxidation process previously described may be used to form the second LOCOS layer 134. In one implementation, the second LOCOS layer 134 has a thickness in the range of about 500 Å to 1,500 Å at the center of the second region 127. No second LOCOS layer 134 is grown in the first region 125 due to the presence of the ODB remnant 130A. While shown as the second LOCOS layer 134, in some cases the second LOCOS structure 124 will effectively be a homogeneous oxide structure that is thicker than the first LOCOS structure 122, and may have no discernable interface between the LOCOS layers 119 and 134. Because the ODB spacers 130B reduce or prevent oxide growth at the sides of the LOCOS structure 124, the final structure may have a thicker central portion, e.g. having the first LOCOS layer 119 and top and bottom portions of the second LOCOS layer 134, and thinner side portions, e.g. having the first LOCOS layer 119 and only the bottom portion of the second LOCOS layer 134.

It is possible to use a blanket etch of the sacrificial layer 132 (FIG. 1C) to create the sacrificial remnant 132A and the sacrificial sidewall spacers 132B because the first opening 121 (FIG. 1B) is narrower than the second opening 123 (FIG. 1B). The wider openings allow the etchant greater access than do the narrower openings, so that sizing the respective openings used for the first LOCOS structure 122 and the second LOCOS structure 124 can determine how much of a particular thickness of the sacrificial layer 132 (FIG. 1C) will be removed from an area overlying the respective LOCOS structure.

Figure 1G:
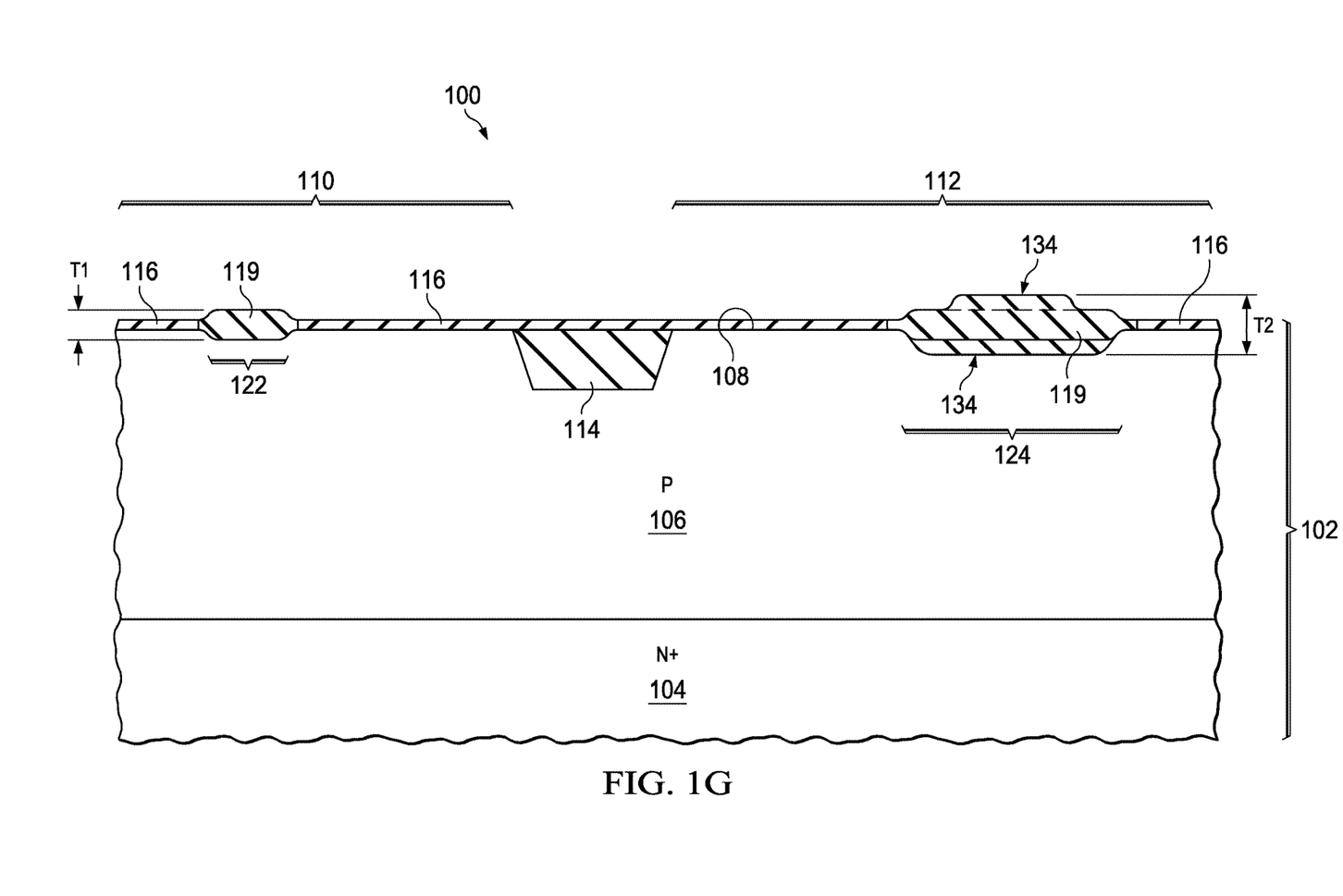

FIG. 1G depicts the IC 100 after removal of the first ODB layer 118 (FIG. 1F), the ODB remnant 130A (FIG. 1F), and the ODB spacers 130B (FIG. 1F). As shown, the first LOCOS structure 122 has a first thickness T1 and the second LOCOS structure 124 has a second thickness T2 that is greater than T1. In one implementation, the thinner first LOCOS structure 122 is used to form the LOCOS field relief oxide for the first MOS transistor 110, which will have a lower voltage than the second MOS transistor 112. This completes fabrication of the first LOCOS structure 122 and the second LOCOS structure 124, which have different thicknesses from each other, although additional processing of the IC 100 remains.

Figure 1H:
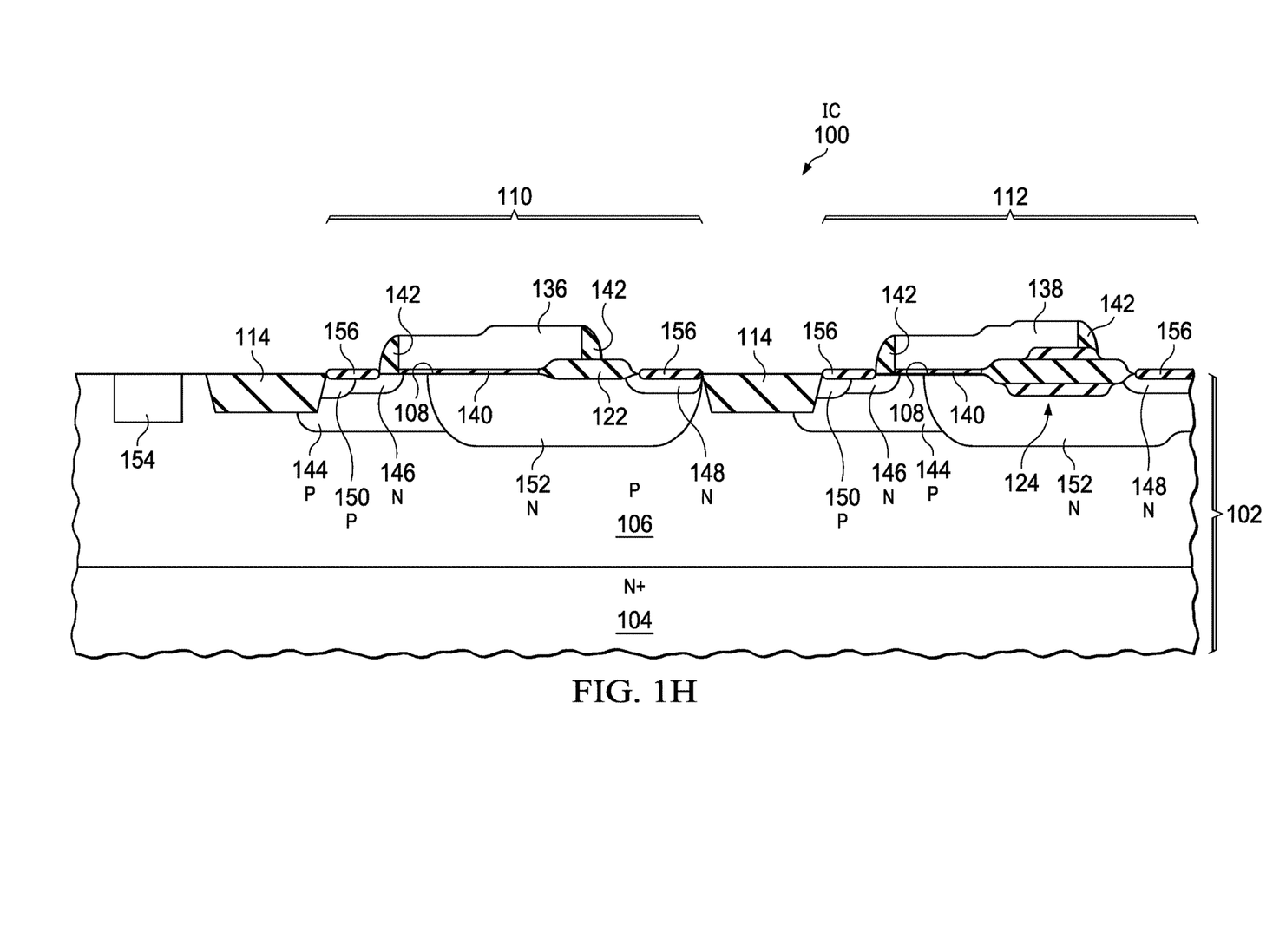

FIG. 1H depicts the IC 100 after fabrication of the first MOS transistor 110 and the second MOS transistor 112, an implementation of which is briefly described. The process further includes forming a first gate electrode 136 for the first MOS transistor 110, with the first gate electrode 136 partially over the first LOCOS structure 122, and a second gate electrode 138 for second MOS transistor 112, with the second gate electrode 138 partially over the second LOCOS structure 124.

In one implementation, a gate dielectric layer 140 is formed over exposed semiconductor material at the top surface 108 of the substrate 102, including in the areas for the first MOS transistor 110 and the second MOS transistor 112. The gate dielectric layer 140 may include silicon dioxide, formed by thermal oxidation, and/or hafnium oxide or zirconium oxide, formed by CVD processes. A thickness of the gate dielectric layer 140 reflects operating voltages of the first MOS transistor 110 and the second MOS transistor 112. A layer of gate electrode material (not explicitly shown) is formed over the gate dielectric layer 140, the first LOCOS structure 122, and the second LOCOS structure 124, then patterned and etched to form the first gate electrode 136 and the second gate electrode 138. The gate electrode material may include, for example, polycrystalline silicon, referred to herein as polysilicon, possibly doped with n-type dopants. Other gate materials, such as titanium nitride or other metal comprising material for the gate electrode material are within the scope of the instant example. Polysilicon as the gate electrode material may have a thickness in the range, for example, of about 300 nanometers to 800 nanometers.

Gate sidewall spacers 142 may be formed on side surfaces of the first gate electrode 136 and the second gate electrode 138, e.g., by forming a conformal layer of sidewall material, possibly comprising more than one sub-layer of silicon nitride and/or silicon dioxide, over the first gate electrode 136, the second gate electrode 138, and the top surface 108 of the substrate 102. Subsequently, an anisotropic etch such as a reactive ion etch (RIE) process removes the layer of sidewall material from top surfaces of the first gate electrode 136, the second gate electrode 138, and the substrate 102, leaving the gate sidewall spacers 142 in place.

Fabrication of the gate sidewall spacers 142 is followed by formation of respective source regions and respective drain regions for the first MOS transistor 110 and the second MOS transistor 112. In an implementation of N-type MOS transistors, a respective P-type body 144 is formed for each of the first gate electrode 136 and the second gate electrode 138. The P-type body 144 may be formed by implanting P-type dopants such as boron at one or more energies, to provide a desired distribution of the P-type dopants. A subsequent anneal process, such as a rapid thermal anneal, activates and diffuses the implanted boron.

A respective N-type source region 146 and a respective N-type drain contact region 148 of the first MOS transistor 110 and the second MOS transistor 112 may be formed by implanting N-type dopants such as phosphorus and arsenic, into the substrate 102 adjacent to the first gate electrode 136 and the second gate electrode 138 for the source and adjacent to the first LOCOS structure 122 and the second LOCOS structure 124 for the drain, followed by an anneal operation, such as a spike anneal or a flash anneal, to activate the implanted dopants. An N-type extension (not separately shown) of the respective N-type source regions 146 that extends partway under the first gate electrode 136 and the second gate electrode 138 may be formed prior to forming the gate sidewall spacers 142 by implanting N-type dopants into the substrate adjacent to the first gate electrode 136 and the second gate electrode 138.

A respective P-type body contact region 150 in the respective P-type body 144 of the first MOS transistor 110 and the second MOS transistor 112 may be formed by implanting P-type dopants such as boron into the substrate 102, followed by an anneal operation, such as a spike anneal or a flash anneal, to activate the implanted dopants. A drift region 152 can then be formed to be self-aligned with the first LOCOS structure 122 and the second LOCOS structure 124 to provide a desired low value of the lateral distance that the first gate electrode 136 and the second gate electrode 138 overlap the respective drift region 152, advantageously providing a low gate-drain capacitance. Alternatively, the drift region 152 may be formed at a significantly earlier stage of the process. Further, the self-aligned configuration may provide the lateral distance to be controllable from device to device without undesired variability due to unavoidable photolithographic alignment variations, sometimes referred to as alignment errors. Functional circuitry 154 is shown as a block that includes circuit elements (including transistors, and generally diodes, resistors, capacitors, etc.) formed at the top surface 108 of the substrate 102 for realizing at least one circuit function such as analog (e.g., an amplifier. power converter or power field effect transistor (FET)), radio frequency (RF), digital, or a memory function. A metal silicide 156 may be formed over the respective N-type source region 146, the respective N-type drain contact region 148, and the respective P-type body contact region 150.

Once a process for fabrication of an IC that includes the first LOCOS structure 122 having a first thickness T1 (FIG. 1G) and a second LOCOS structure 124 having a second thickness T2 (FIG. 1G) that is greater than T1 is placed in production, it can be expected that similar chips may be designed that use two different thicknesses of LOCOS, e.g., a third thickness T3 and a fourth thickness T4. Because a blanket etch is used on the sacrificial layer 132 (FIG. 1C) to create the sacrificial remnant 132A (FIG. 1D) and the sacrificial sidewall spacers 132B (FIG. 1D), the thickness TO of the sacrificial layer 132 may need to be adjusted, as well as determining the widths of the first opening 121 (FIG. 1A) and the second opening 123 (FIG. 1A).

Figure 2A:
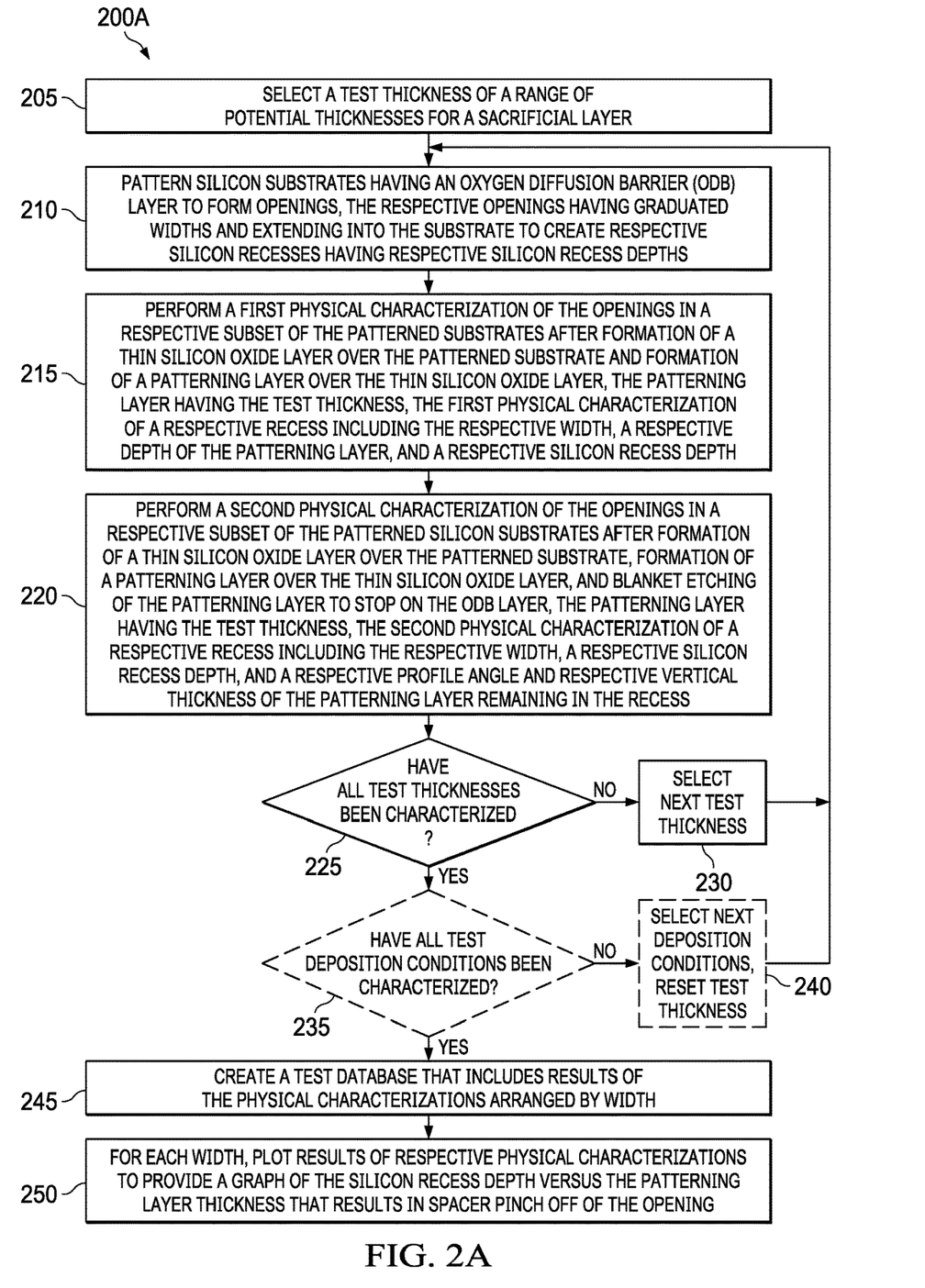
FIG. 2A depicts the first part of a two-part method of facilitating fabrication of an IC on a semiconductor substrate according to an implementation of the disclosure.
Figure 2B:
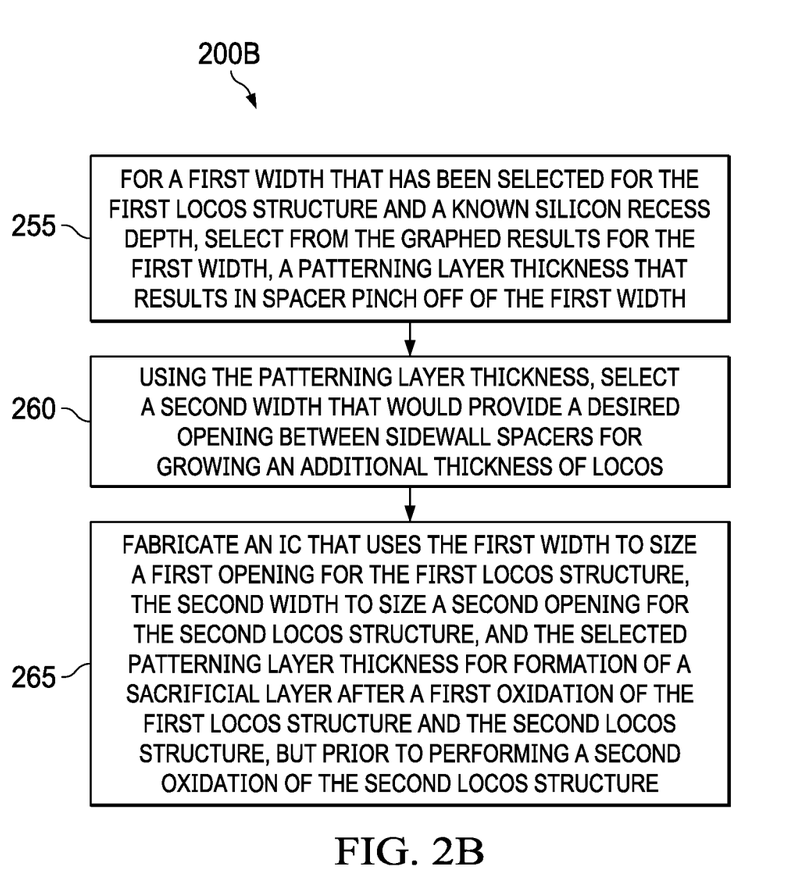
FIG. 2B depicts the second part of the two-part method of facilitating fabrication of an IC on a semiconductor substrate according to an implementation of the disclosure.

As noted previously, Applicants have provided a two-part method for facilitating fabrication of an IC containing two LOCOS structures having different thicknesses. FIG. 2A depicts a first part, e.g., a method 200A in which test openings having a range of widths can be processed with various thicknesses of a sacrificial layer to create a test database and a series of characteristics that relate LOCOS structure widths to thickness of the sacrificial layer. Once the test database is created, FIG. 2B depicts a second part, e.g., a method 200B of determining, using an initial width for the smaller opening for the thinner LOCOS structure and a respective silicon recess depth, an appropriate thickness of the sacrificial layer and an appropriate width that will have a desired opening at the selected thickness of the sacrificial layer. To more clearly differentiate between the testing phase and the production phase, the discussion below refers to a patterning layer and an ODB layer during the testing phase and to a corresponding sacrificial layer and a corresponding sacrificial ODB layer during the production phase.

For purposes of this application, spacer pinch off occurs in an opening when, after the sacrificial layer, e.g., the sacrificial layer 132 (FIG. 1C), has been etched to stop on the ODB layer (FIG. 1C), an amount of the sacrificial layer remaining in the opening, e.g., the sacrificial remnant 132A (FIG. 1D) protects the underlying portions of the second ODB layer during removal of the exposed portions of the second ODB layer. The amount of the sacrificial layer remaining may be affected by the thicknesses of the first ODB layer and the second ODB layer, the specific composition of the sacrificial layer used and the specific etch used to remove the sacrificial layer.

The disclosed two-part method can be performed after selection of the materials to be used in the ODB layer and the sacrificial layer, the method of depositing the sacrificial layer, and the method of etching the sacrificial layer; each of these selections is maintained throughout the characterization and the production process. In one implementation, selection of the conditions used for deposition of the sacrificial layer may be assisted by the present method, as will be shown. A range of test thicknesses for the sacrificial layer may be determined. In one implementation, the ODB layer and the sacrificial ODB layer include silicon nitride while the patterning layer and the sacrificial layer include polysilicon. In one implementation, the polysilicon is deposited in a furnace with a traditional CVD process using silane and $N_2$ gases at a temperature in the range of 550-650° C.; and the polysilicon etch uses a reactive anisotropic plasma etch with a mixture of chloro/fluoro-carbons. The polysilicon can have a thickness in the range of about 400 Å to 1,500 Å.

FIG. 2A depicts the method 200A of the two-part method, which begins by selecting a test thickness from the range of test thicknesses for a sacrificial layer (205); all of the test thicknesses will be characterized. A number of silicon substrates are provided and each contains an ODB layer over the substrate. In one implementation, the ODB layer may be silicon nitride having a thickness in the range of about 100 Å to 500 Å. The ODB layer over the substrate is patterned to form openings through the ODB layer to reach the silicon substrate (210).

As noted in the '812 patent and repeated above in the discussion of FIG. 1A, the creation of the first opening 121 and the second opening 123 may be extended into the substrate 102 using a silicon etch to enable deeper current flow for the respective MOS transistors. It is also recognized that using the same etch process, openings having different widths may be etched to different silicon recess depths. For example, larger widths may form silicon recesses that have a greater depth than smaller widths because the etch process has greater access to the substrate in the larger widths. In order to cover such variations, the provided openings have both graduated widths and graduated silicon recess depths, which is the depth the recess extends into the substrate. In one implementation, the openings may be formed with widths in increments of 0.1 µm between 0.2 µm and 1.0 µm; and the silicon recess depths may be provided in increments of 100 Å between 0 Å and 500 Å.

Figure 3A:
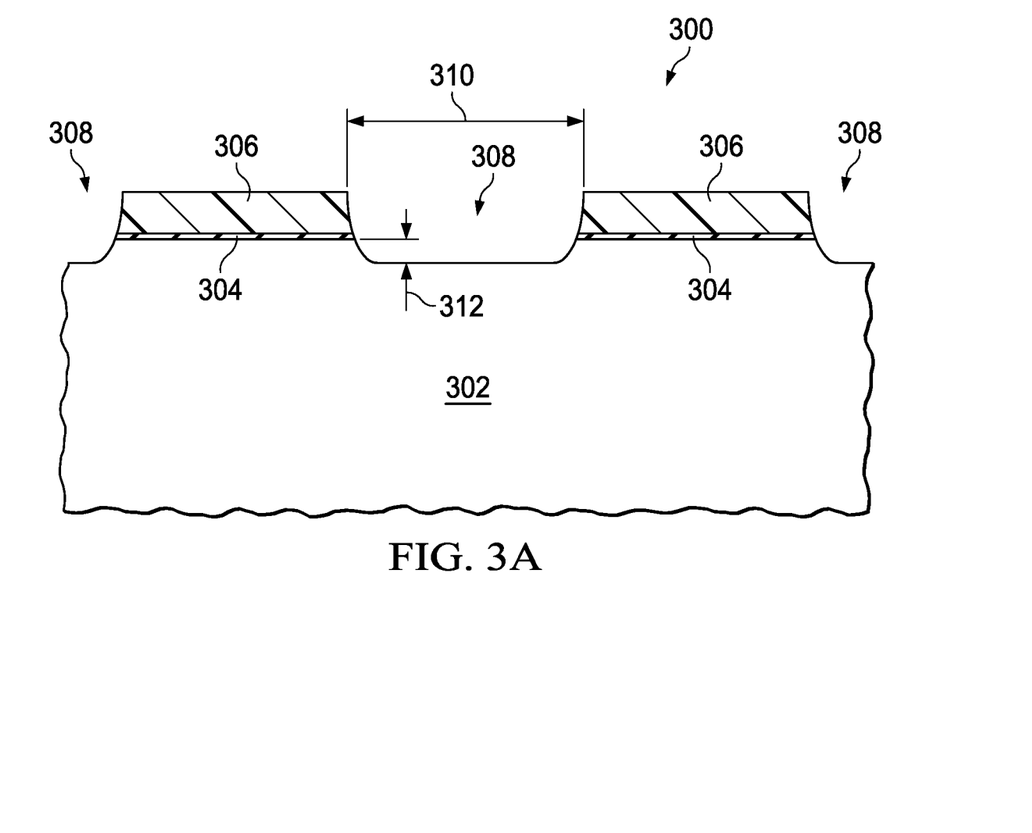
FIG. 3A depicts several of the measurements taken to determine the depth of a sacrificial layer to deposit in a fabrication method according to an implementation of the disclosure.

FIG. 3A shows an example portion of a wafer 300 having a silicon substrate 302 with a patterned ODB layer. Wafer 300 includes the silicon substrate 302, a pad oxide 304, and an ODB layer 306, with portions of three openings 308 shown. These three openings 308 each have a width 310 and each extends into the silicon substrate for a silicon recess depth 312. In the particular implementation depicted, the width 310 is equal to about 260 nm and the silicon recess depth 312 is about 40 nm.

For a subset of the patterned substrates, the method forms a thin silicon oxide layer over the patterned substrate; forms a patterning layer over the thin silicon oxide layer; and performs a first physical characterization of the openings (215). The patterning layer is formed to the selected test thickness and the first physical characterization includes the respective width, a respective depth of the patterning layer, and a respective silicon recess depth.

For another subset of the patterned substrates, the method forms a thin silicon oxide layer over the patterned substrate; forms the patterning layer over the thin silicon oxide layer; blanket etches the patterning layer to stop on the ODB layer; and performs a second physical characterization of the openings (220). The patterning layer will again be formed to the test thickness and the second physical characterization includes the respective width, a respective silicon recess depth, and a respective profile angle and a respective vertical thickness of the patterning layer remaining in the recess.

The method then determines whether all the test thicknesses of the patterning layer have been characterized (225). If the answer is "No", a next test thickness is selected (230) and the method returns to patterning a set of silicon substrates (210). If the answer is "Yes", the method may optionally make an additional determination whether all test deposition conditions have been characterized (235). This determination is made only if there are potential variations in the deposition conditions that would affect the process. If the answer is "No", a next set of deposition conditions is selected, the test thicknesses are reset so that they will be characterized using the new deposition conditions (240), and the method returns to pattern a set of silicon substrates (210).

If the answer is "Yes", the method creates a test database that includes results of the physical characterizations arranged by width (245) and, if necessary also by deposition conditions. The test database can indicate when an opening having the width is spacer pinched off, and when the opening is not spacer pinched off, the test database includes the amount and depth of the patterning layer remaining in the opening. The test database thus makes reference to the test data easy to obtain.

Figure 3B:
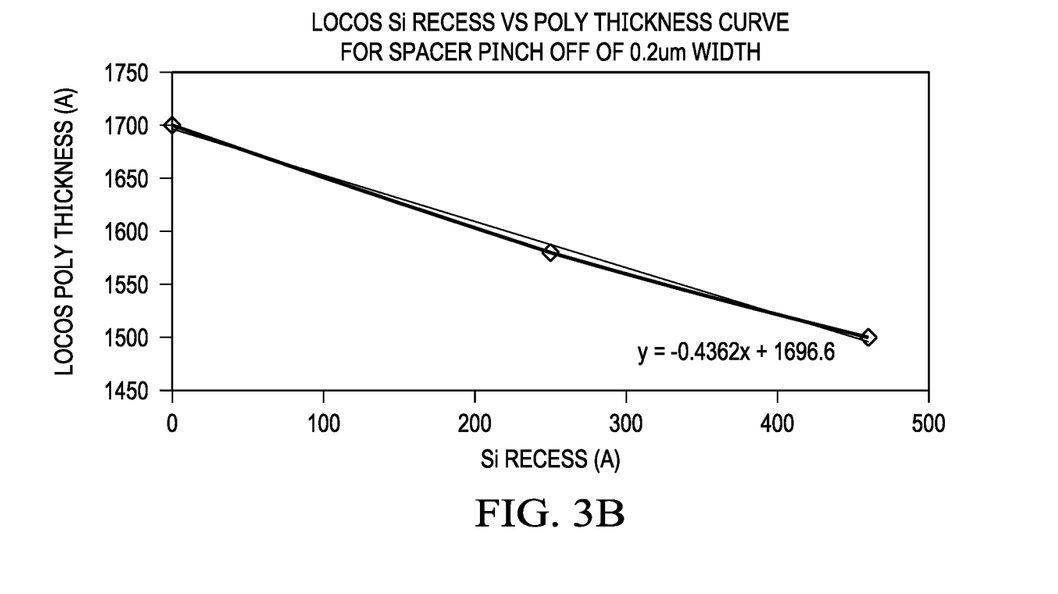
FIG. 3B depicts a graph used to determine the depth of the sacrificial layer to deposit in a fabrication method according to an implementation of the disclosure.

The method then plots, for each width and potentially for each width under each of the deposition conditions, results of the respective physical characterizations to provide a graph of the silicon recess depth versus the patterning layer thickness that results in spacer pinch off of the opening (250). An example of such a graph is shown in FIG. 3B and is associated with spacer pinch off in a 0.2 µm opening. In this example, three data points are shown, for silicon recess depths of about 0 Å, about 279 Å, and about 457 Å. The first part of the two-part method is now complete.

FIG. 2B depicts the method 200B of the two-part method, which may be used whenever production is anticipated of a new chip that uses the method shown in FIGS. 1A to 1G to create two LOCOS structures having different thicknesses. Typically, a first width for the first LOCOS structure has been selected and a silicon recess depth has been determined after preparation of a patterned OBD layer. Using the first widths and the known silicon recess depth, the method selects, from the graphed results, a patterning layer thickness that results in spacer pinch off of the first width (255). More specifically, using a graph that has been created for the first widths, the method may locate the appropriate silicon recess depth on a first axis, e.g., the X-axis, and may read the corresponding patterning layer thickness on a second axis, e.g., the Y-axis. In an example implementation having a widths of 0.2 µm, the graph shown in FIG. 3B is used; for a silicon recess depth of about 250 Å, a patterning layer thickness of about 1588 Å would be selected.

Once the patterning layer thickness is determined, the method selects a second width that would provide a desired opening between sidewall spacers for growing an additional thickness of LOCOS (260). While complete spacer pinch off would not generally occur in widths larger than the first width, the saved database can be consulted to ensure that the second width does not result in sidewall spacers that provide an inadequate exposure of the underlying second LOCOS structure. Such a problem may occur, e.g., when a thin film of the patterning layer remains in the bottom of an opening, e.g., of a next larger width.

After selecting the second width, these three elements—the first width, the second width and the patterning layer thickness can be used to fabricate the IC (265). That is, the first width is used to size a first opening for the first LOCOS structure and the second width is used to size a second opening for the second LOCOS structure. After a first oxidation of the first LOCOS structure and the second LOCOS structure but prior to a second oxidation of the second LOCOS structure, a sacrificial layer is formed to the selected patterning layer thickness. Not only is a mask removed from the process disclosed in the '812 patent, but adjustments to the basic process are facilitated by the disclosed testing and plotting of data that can be used during the adjustments.

Although various implementations have been shown and described in detail, the claims are not limited to any particular implementation or example. In particular, although the process has been described for two different thicknesses of LOCOS structures, the process can be adjusted to allow thicknesses of LOCOS structures. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the present claims.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

It should further be understood that the order or sequence of the acts, steps, functions, components or blocks illustrated in any of the flowcharts depicted in the drawing Figures of the present disclosure may be modified, altered, replaced, customized or otherwise rearranged within a particular flowchart, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of the present patent disclosure. Accordingly, those skilled in the art will recognize that the example implementations described herein can be practiced with various modifications and alterations within the spirit and scope of the claims appended below.

What is claimed is:

1. A method of fabricating an integrated circuit, comprising:
    forming a first opening having a first width and a second opening having a second width in a first dielectric layer over a silicon substrate, the openings exposing the silicon substrate;
    oxidizing the exposed silicon substrate to form first and second local oxidation of silicon (LOCOS) structures having a first thickness, the first and second LOCOS structures including bird's beaks;
    forming a polysilicon layer over the silicon substrate, the polysilicon layer filling the first and second openings;
    performing a blanket etch of the polysilicon layer, wherein the first width is less than a minimum width above which the silicon substrate is exposed in the first opening, by the blanket etch, and the second width is greater than the minimum width, thereby removing at least a portion of the polysilicon layer over the second LOCOS structure while leaving the first LOCOS structure protected by the polysilicon layer; and
    further oxidizing the silicon substrate under the second LOCOS structure such that the second LOCOS structure has a second thickness greater than the first thickness.

2. The method of claim 1, further comprising forming a second dielectric layer over the first LOCOS structure and the second LOCOS structure before forming the polysilicon layer.

3. The method of claim 2, wherein the first dielectric layer is thicker than the second dielectric layer.

4. The method of claim 2, wherein the first dielectric layer and the second dielectric layer each comprises SiN.

5. The method of claim 1, wherein the first dielectric layer comprises SiN.

6. The method of claim 1, wherein a thickness of the polysilicon layer is determined based on the first width.

7. The method of claim 1, further comprising forming a first gate electrode over the first LOCOS structure and a second gate electrode over the second LOCOS structure, the first gate electrode and the first LOCOS structure being components of a first metal-oxide-semiconductor (MOS) transistor and the second gate electrode and the second LOCOS structure being components of a second MOS transistor.

8. The method of claim 7, wherein the second transistor is configured to operate at a greater voltage than is the first transistor.

9. A method of fabricating an integrated circuit (IC), comprising:
    determining a deposition thickness of a sacrificial layer to be formed over a semiconductor substrate having an oxygen diffusion barrier (ODB) layer located thereover, the ODB layer having first and second openings respectively having a first width and a greater second width that expose the semiconductor substrate, the determining being based on one or both of the first width and the second width;
    forming a first LOCOS structure under the first opening and a second LOCOS structure under the second opening, the first and second LOCOS structures including corresponding bird's beaks;
    forming the sacrificial layer having the deposition thickness over the semiconductor substrate, the ODB layer and the first and second openings; and
    blanket etching the sacrificial layer, the deposition thickness and the first width being such that the first LOCOS structure is completely covered by a first remaining portion of the sacrificial layer after the blanket etching, and the deposition thickness and the second width being such that the second LOCOS structure is exposed between sidewall spacers located over the second LOCOS structure after the blanket etching.

10. The method as recited in claim 9, wherein the determining includes retrieving the deposition thickness from a test database that provides different values of the deposition thickness for different combinations of the first and second widths.

11. The method as recited in claim 10, wherein the test database provides different values of the deposition thickness for different combinations of the first and second widths and further provides a recess depth of respective silicon recesses located under the first and second openings prior to forming the sacrificial layer.

12. The method as recited in claim 11, wherein determining the deposition thickness includes selecting a thickness of the sacrificial layer as a function of the recess depth.

13. The method as recited in claim 9, wherein the ODB layer includes silicon nitride and the sacrificial layer includes polysilicon.

14. The method as recited in claim 9, wherein the ODB layer is a first ODB layer, and further comprising forming a second ODB layer over the first and second LOCOS structures prior to forming the sacrificial layer.

15. The method of claim 9, further comprising forming a first gate electrode over the first LOCOS structure and a second gate electrode over the second LOCOS structure, the first gate electrode and the first LOCOS structure being components of a first MOS transistor configured to operate at a first voltage and the second gate electrode and the second LOCOS structure being components of a second MOS transistor configured to operate at a second greater voltage.

16. A method of forming an integrated circuit, the method comprising:
   selecting a polysilicon thickness of a polysilicon layer predetermined to result in a continuous first remaining portion of the polysilicon layer remaining in a first opening having a first width in a first oxygen diffusion barrier (ODB) layer over a silicon substrate after removing the polysilicon layer over the first ODB layer;
   selecting a second width of a second opening in the first ODB layer based on the polysilicon thickness, the second width predetermined to result in a space between second remaining portions of the polysilicon layer in the second opening after removing the polysilicon layer over the first ODB layer;
   forming the first ODB layer over the silicon substrate;
   forming in the first ODB layer the first opening having the first width and the second opening having the second width;
   forming a first LOCOS structure in the first opening and a second LOCOS structure in the second opening, the first and second LOCOS structures including bird's beaks; and
   forming the polysilicon layer with the polysilicon thickness over the silicon substrate, filling the first and second openings.

17. The method as recited in claim 16, further comprising performing a blanket etch of the polysilicon layer, the blanket etch exposing a second ODB layer between the second remaining portions.

18. The method as recited in claim 17, further comprising oxidizing the silicon substrate between the second remaining portions, thereby increasing the thickness of the second LOCOS structure but not the first LOCOS structure.

19. The method as recited in claim 17, wherein the first and second ODB layers comprise silicon nitride.

20. The method of claim 18, further comprising forming a first gate electrode over the first LOCOS structure and a second gate electrode over the second LOCOS structure, the first gate electrode and the first LOCOS structure being components of a first MOS transistor configured to operate at a first voltage and the second gate electrode and the second LOCOS structure being components of a second MOS transistor configured to operate at a second greater voltage.

* * * * *